(12) United States Patent
Kim et al.

(10) Patent No.: US 10,861,991 B2
(45) Date of Patent: Dec. 8, 2020

(54) COMPOUND SEMICONDUCTOR SOLAR CELL AND METHOD OF MANUFACTURING THE SAME

(71) Applicant: LG ELECTRONICS INC., Seoul (KR)

(72) Inventors: Soohyun Kim, Seoul (KR); Gunho Kim, Seoul (KR); Hyun Lee, Seoul (KR); Wonseok Choi, Seoul (KR); Younho Heo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 126 days.

(21) Appl. No.: 15/904,019

(22) Filed: Feb. 23, 2018

(65) Prior Publication Data

US 2018/0248059 A1 Aug. 30, 2018

(30) Foreign Application Priority Data

Feb. 24, 2017 (KR) ........................ 10-2017-0025120
Apr. 25, 2017 (KR) ........................ 10-2017-0053005

(51) Int. Cl.
*H01L 31/0352* (2006.01)
*H01L 31/0224* (2006.01)
*H01L 31/0735* (2012.01)
*H01L 31/18* (2006.01)

(52) U.S. Cl.
CPC ........... *H01L 31/035281* (2013.01); *H01L 31/022425* (2013.01); *H01L 31/0735* (2013.01); *H01L 31/184* (2013.01); *H01L 31/186* (2013.01); *H01L 31/1844* (2013.01); *H01L 31/1892* (2013.01); *Y02E 10/544* (2013.01); *Y02P 70/50* (2015.11)

(58) Field of Classification Search
None
See application file for complete search history.

(56) References Cited

U.S. PATENT DOCUMENTS 5,342,453 A * 8/1994 Olson ............... H01L 31/02168
136/262
6,132,585 A 10/2000 Midorikawa et al.
(Continued)

FOREIGN PATENT DOCUMENTS

KR 10-1997-0005153 B1 4/1997
KR 10-2015-0092608 A 8/2015

OTHER PUBLICATIONS

Abbott,"Laser Isolation of Shunted Regions in Industrial Solar Cells,"Prog. Photovolt: Res. Appl. 2007; 15:613-620 (Year: 2007).*

*Primary Examiner* — Devina Pillay
(74) *Attorney, Agent, or Firm* — Birch, Stewart, Kolasch & Birch LLP

(57) ABSTRACT

A compound semiconductor solar cell and a method of manufacturing the same are disclosed. The compound semiconductor solar cell includes a compound semiconductor layer, a front electrode positioned on a front surface of the compound semiconductor layer, a back electrode positioned on a back surface of the compound semiconductor layer, a defect portion disposed within the compound semiconductor layer and physically and electrically connected to the back electrode, and an isolation portion surrounding the defect portion.

6 Claims, 10 Drawing Sheets

(56) References Cited

U.S. PATENT DOCUMENTS

| | | | |
|---|---|---|---|
| 7,989,729 B1* | 8/2011 | Zhao | G01J 1/08 |
| | | | 136/244 |
| 9,018,020 B2* | 4/2015 | Chiu | H01L 31/186 |
| | | | 438/4 |
| 2004/0053769 A1* | 3/2004 | Wotting | C04B 35/589 |
| | | | 501/92 |
| 2007/0227586 A1 | 10/2007 | Zapalac, Jr. | |
| 2010/0084015 A1* | 4/2010 | Chang | H01L 31/046 |
| | | | 136/256 |
| 2010/0087025 A1* | 4/2010 | Chang | H01L 31/046 |
| | | | 438/58 |
| 2010/0210040 A1 | 8/2010 | Basol | |
| 2010/0248451 A1* | 9/2010 | Pirogovsky | B23K 26/38 |
| | | | 438/463 |
| 2011/0151591 A1 | 6/2011 | Yamamuro et al. | |
| 2014/0179084 A1* | 6/2014 | Lei | H01L 21/78 |
| | | | 438/463 |

* cited by examiner (a) (b)

FIG. 8

| 18.7 | 22.2 | 20.5 |
|------|------|------|
| 20.2 | 21.8 | 20.2 |
| 21.4 | 22.0 | 19.4 |

(a)

| 21.8 | 22.2 | 20.9 |
|------|------|------|
| 22.0 | 22.2 | 21.8 |
| 22.6 | 22.3 | 21.4 |

(b)

COMPOUND SEMICONDUCTOR SOLAR CELL AND METHOD OF MANUFACTURING THE SAME

CROSS-REFERENCE TO RELATED APPLICATION

This application claims the priority benefit of Korean Patent Application No. 10-2017-0025120 filed in the Korean Intellectual Property Office on Feb. 24, 2017 and Korean Patent Application No. 10-2017-0053005 filed in the Korean Intellectual Property Office on Apr. 25, 2017, the entire contents of each of these applications are incorporated herein by reference in its entirety.

BACKGROUND OF THE INVENTION

Field of the Invention

The present disclosure relates to a compound semiconductor solar cell and a method of manufacturing the same, and more particularly to a compound semiconductor solar cell and a method of manufacturing the same for efficiently isolating a defect portion formed when the compound semiconductor solar cell is manufactured.

Description of the Related Art

A compound semiconductor is not made of a single element such as silicon (Si) and germanium (Ge) and is formed by a combination of two or more kinds of elements to operate as a semiconductor. Various kinds of compound semiconductors have been currently developed and used in various fields. The compound semiconductors are typically used for a light emitting element, such as a light emitting diode and a laser diode, and a solar cell using a photoelectric conversion effect, a thermoelectric conversion element using a Peltier effect, and the like.

A compound semiconductor solar cell forms various layers using a III-V compound semiconductor such as gallium arsenide (GaAs), indium phosphide (InP), gallium aluminum arsenide (GaAlAs) and gallium indium arsenide (GaInAs), a II-VI compound semiconductor such as cadmium sulfide (CdS), cadmium telluride (CdTe) and zinc sulfide (ZnS), a I-III-VI compound semiconductor such as copper indium selenide ($CuInSe_2$), and the like.

The various layers made of the compound semiconductor are formed by a metal organic chemical vapor deposition (MOCVD) method, a molecular beam epitaxy (MBE) method, or other proper methods for forming an epitaxial layer. In this instance, when a compound semiconductor layer is formed on a mother substrate, the compound semiconductor layer and the mother substrate are separated from each other due to particles entering into a compound semiconductor layer forming equipment (for example, a MOCVD chamber). Then, an empty space is formed in the compound semiconductor layer.

Thus, when a back electrode is formed on the compound semiconductor layer after the compound semiconductor layer and the mother substrate are separated, an electrode forming material (hereinafter, referred to as "defect portion") for forming the back electrode is filled in the empty space of the compound semiconductor layer.

The electrode forming material filled in the empty space of the compound semiconductor layer is electrically connected to the side of the compound semiconductor layer and thus generates a leakage current. Hence, efficiency of the compound semiconductor solar cell is reduced. Further, when the electrode forming material contacts a front electrode (for example, a plurality of finger electrodes and at least one bus bar electrode), there occurs a contact point at which an electric current is leaked in a contact region between the defect portion and the front electrode. Hence, the efficiency of the compound semiconductor solar cell is greatly reduced. In the worst case, a short circuit occurs, and the compound semiconductor solar cell cannot be used.

Accordingly, when the compound semiconductor solar cell is manufactured, a method capable of efficiently isolating the defect portion formed by the particles is required.

SUMMARY OF THE INVENTION

The present disclosure provides a compound semiconductor solar cell and a method of manufacturing the same capable of efficiently isolating a defect portion formed when the compound semiconductor solar cell is manufactured.

In one aspect, there is provided a compound semiconductor solar cell including a compound semiconductor layer, a front electrode positioned on a front surface of the compound semiconductor layer, a back electrode positioned on a back surface of the compound semiconductor layer, a defect portion disposed within the compound semiconductor layer and physically and electrically connected to the back electrode, and an isolation portion surrounding the defect portion.

The defect portion may be formed of the same metal material as the back electrode, and the isolation portion may expose a portion of the back electrode.

The isolation portion may expose a side of the defect portion.

In this instance, a planar shape of the isolation portion may be similar to a planar shape of the defect portion.

Accordingly, because a size of the isolation portion can be minimized, a reduction in a light incident area resulting from the isolation portion can be minimized.

The defect portion may include at least two defect portions, and the isolation portion may include at least two isolation portions. The at least two isolation portions have different planar shapes.

In another aspect, there is provided a method of manufacturing a compound semiconductor solar cell including a defect portion that is disposed within a compound semiconductor layer, is formed of the same material as a back electrode, and is physically connected to the back electrode, the method including forming an uppermost layer of the compound semiconductor layer using a first compound semiconductor that has a high selectivity to a first etching solution and is etched by a second etching solution; forming a protective layer including a single layer or at least two layers at the uppermost layer of the compound semiconductor layer, the single layer being formed of a second compound semiconductor that has a high selectivity to the second etching solution and is etched by the first etching solution, the at least two layers being formed by alternately laminating a layer formed of the second compound semiconductor and a layer formed of the first compound semiconductor; performing a first etching process using the first etching solution or the second etching solution that has a high selectivity to the first compound semiconductor or the second compound semiconductor forming a layer positioned at an uppermost part of the protective layer; performing a second etching process using the second etching solution or the first etching solution to remove the layer positioned at the uppermost part of the protective layer; and repeatedly performing the first etching process and the second etching process until the protective layer is completely removed and selectively removing a portion of the compound semiconductor layer directly contacting a defect portion to thereby form an isolation portion surrounding the defect portion, the isolation portion exposing the side of the defect portion.

The first compound semiconductor forming the uppermost layer of the compound semiconductor layer may be formed of GaAs, and the second compound semiconductor forming a lowermost layer of the protective layer directly contacting the uppermost layer of the compound semiconductor layer may be formed of GaInP or AlGaInP.

In this instance, the first etching solution may include hydrochloric acid, and the second etching solution may include a solution in which ammonia solution, hydrogen peroxide solution, and ultrapure water are mixed. Further, ammonia solution, hydrogen peroxide solution, and ultrapure water may be mixed at a ratio of 1:2:10.

For example, the protective layer may include a first layer. In this instance, an etching process using the second etching solution and an etching process using the first etching solution may be sequentially performed.

As another example, the protective layer may include a first layer and a second layer that is positioned on the first layer and is formed of the first compound semiconductor. In this instance, an etching process using the first etching solution, an etching process using the second etching solution, and the etching process using the first etching solution may be sequentially performed.

As another example, the protective layer may include a first layer, a second layer that is positioned on the first layer and is formed of the first compound semiconductor, and a third layer that is positioned on the second layer and is formed of the second compound semiconductor. In this instance, an etching process using the second etching solution, an etching process using the first etching solution, the etching process using the second etching solution, and the etching process using the first etching solution may be sequentially performed.

As another example, the protective layer may include a first layer, a second layer that is positioned on the first layer and is formed of the first compound semiconductor, a third layer that is positioned on the second layer and is formed of the second compound semiconductor, and a fourth layer that is positioned on the third layer and is formed of the first compound semiconductor. In this instance, an etching process using the first etching solution, an etching process using the second etching solution, the etching process using the first etching solution, the etching process using the second etching solution, and the etching process using the first etching solution may be sequentially performed.

As another example, the protective layer may include a first layer, a second layer that is positioned on the first layer and is formed of the first compound semiconductor, a third layer that is positioned on the second layer and is formed of the second compound semiconductor, a fourth layer that is positioned on the third layer and is formed of the first compound semiconductor, and a fifth layer that is positioned on the fourth layer and is formed of the second compound semiconductor. In this instance, an etching process using the second etching solution, an etching process using the first etching solution, the etching process using the second etching solution, the etching process using the first etching solution, the etching process using the second etching solution, and the etching process using the first etching solution may be sequentially performed.

As another example a lamination structure of the protective layer may be substantially the same as a lamination structure of the compound semiconductor layer.

The protective layer may be grown at a process temperature lower than a minimum process temperature used to grow the compound semiconductor layer by about 50° C. to 100° C. and also may be grown at a growth rate that is 1.2 to 4 times larger than a maximum growth rate used to grow the compound semiconductor layer.

The etching process using the second etching solution may be performed for about 20 seconds to 4 minutes, and the etching process using the first etching solution may be performed for about 10 seconds to 10 minutes.

According to the above-described manufacturing method, because a separate process for finding the defect portion is not necessary, a manufacturing time of the compound semiconductor solar cell can be reduced.

Further, because a size of the isolation portion can be minimized, a reduction in a light incident area resulting from the isolation portion can be minimized.

After the defect portion is isolated, finger electrodes may be formed. Hence, the number of finger electrodes which cannot be used due to the defect portion can be reduced.

A compound semiconductor layer directly contacting the defect portion may be provided between the defect portion and the isolation portion. The compound semiconductor layer directly contacting the defect portion may be physically spaced apart from a compound semiconductor layer positioned in an outer space of the isolation portion by the isolation portion.

In this instance, the isolation portion may have at least one of a circular planar shape, an oval planar shape, or a polygonal planar shape and have a linewidth of 1 μm or less.

For example, the isolation portion may be formed in a circular planar shape having a diameter of 20 μm to 300 μm or a quadrilateral planar shape of which each side has a length of 20 μm to 300 μm.

The defect portion may include at least two defect portions, and the isolation portion may include at least two isolation portions. In this instance, the at least two isolation portions may have the same planar shape. Alternatively, the at least two isolation portions may have different planar shapes.

In another aspect, there is provided a method of manufacturing a compound semiconductor solar cell including a defect portion that is disposed within a compound semiconductor layer, is formed of the same material as a back electrode, and is physically connected to the back electrode, the method including removing the compound semiconductor layer around the defect portion using a femtosecond laser having a wavelength of 248 nm, 355 nm, or 532 nm and a frequency of 100 kHz to 150 kHz to form an isolation portion surrounding the defect portion, wherein when the isolation portion is formed, the isolation portion exposes a portion of the back electrode without removing the back electrode.

The forming of the isolation portion may include removing the compound semiconductor layer around the defect portion in at least one planar shape of a circular planar shape, an oval planar shape, or a polygonal planar shape having a linewidth of 1 μm or less.

When the laser is irradiated, an inert gas such as a nitrogen gas and an argon gas may be supplied to a laser irradiation region.

BRIEF DESCRIPTION OF THE DRAWINGS

The accompanying drawings, which are included to provide a further understanding of the present disclosure and are incorporated in and constitute a part of this specification, illustrate embodiments of the disclosure and together with the description serve to explain the principles of the present disclosure.

FIG. 8 illustrates efficiency data of a plurality of compound semiconductor solar cells before and after an isolation portion is formed.

DETAILED DESCRIPTION OF THE EMBODIMENTS

Figure 1:
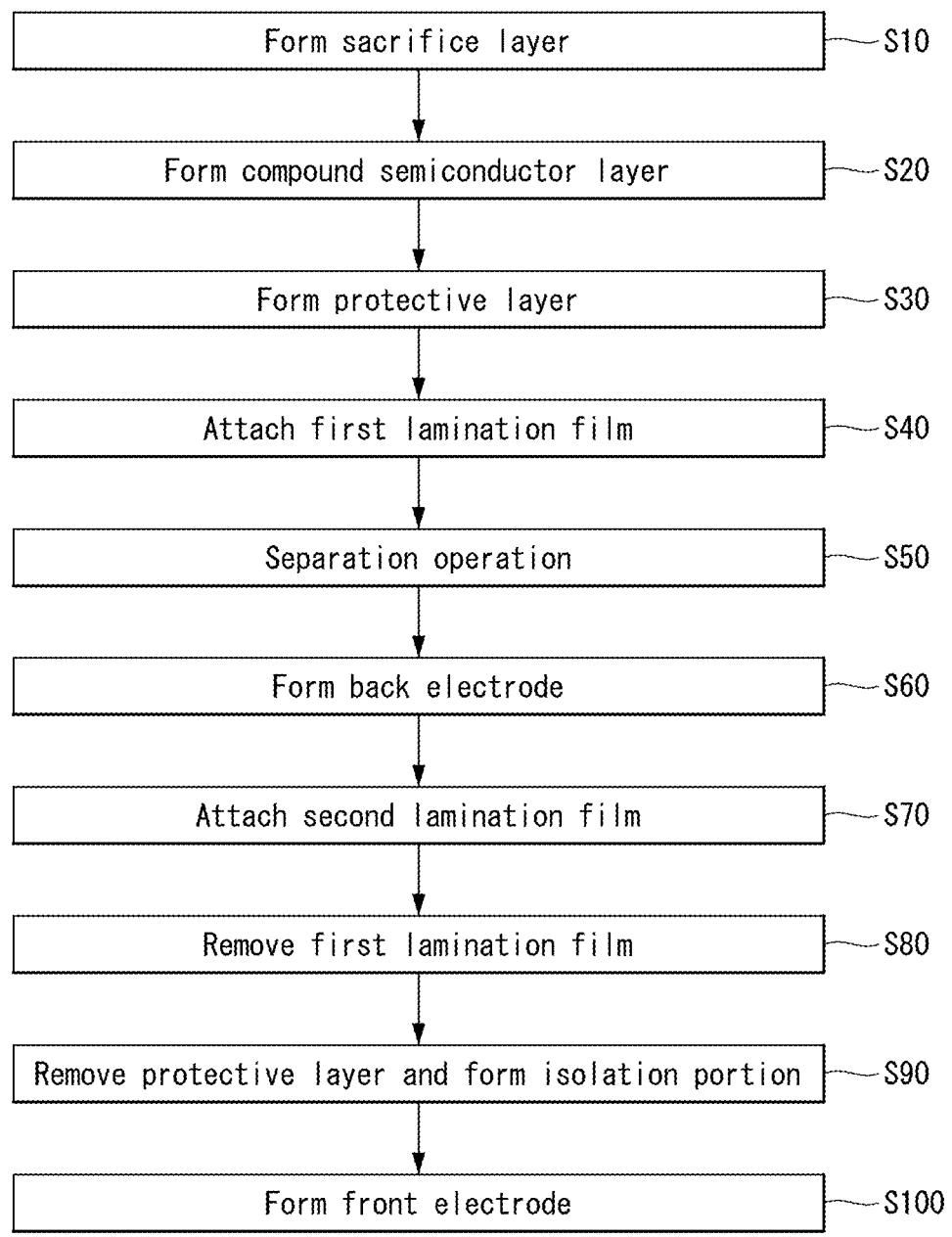
FIG. 1 is a block diagram illustrating a method of manufacturing a compound semiconductor solar cell according to a first embodiment of the disclosure.

Reference will now be made in detail embodiments of the disclosure examples of which are illustrated in the accompanying drawings. Since the present disclosure may be modified in various ways and may have various forms, specific embodiments are illustrated in the drawings and are described in detail in the present specification. However, it should be understood that the present disclosure are not limited to specific disclosed embodiments, but include all modifications, equivalents and substitutes included within the spirit and technical scope of the present disclosure.

The terms "first", "second", etc. may be used to describe various components, but the components are not limited by such terms. The terms are used only for the purpose of distinguishing one component from other components.

For example, a first component may be designated as a second component, and a second component may be designated as a first component without departing from the scope of the present disclosure.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component.

On the other hand, when an arbitrary component is described as "being directly connected to" or "being directly linked to" another component, this should be understood to mean that no component exists between them.

The terms used in the present application are used to describe only specific embodiments or examples, and are not intended to limit the present disclosure. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, have the same meanings as those that are generally understood by a person having ordinary knowledge in the art to which the present disclosure pertains.

The terms defined in a generally used dictionary must be understood to have meanings identical to those used in the context of a related art, and are not to be construed to have ideal or excessively formal meanings unless they are obviously specified in the present application.

The following example embodiments of the present disclosure are provided to those skilled in the art in order to describe the present disclosure more completely. Accordingly, shapes and sizes of elements shown in the drawings may be exaggerated for clarity.

Hereinafter, embodiments of the disclosure are described with reference to FIGS. 1 to 12.

Figure 2:
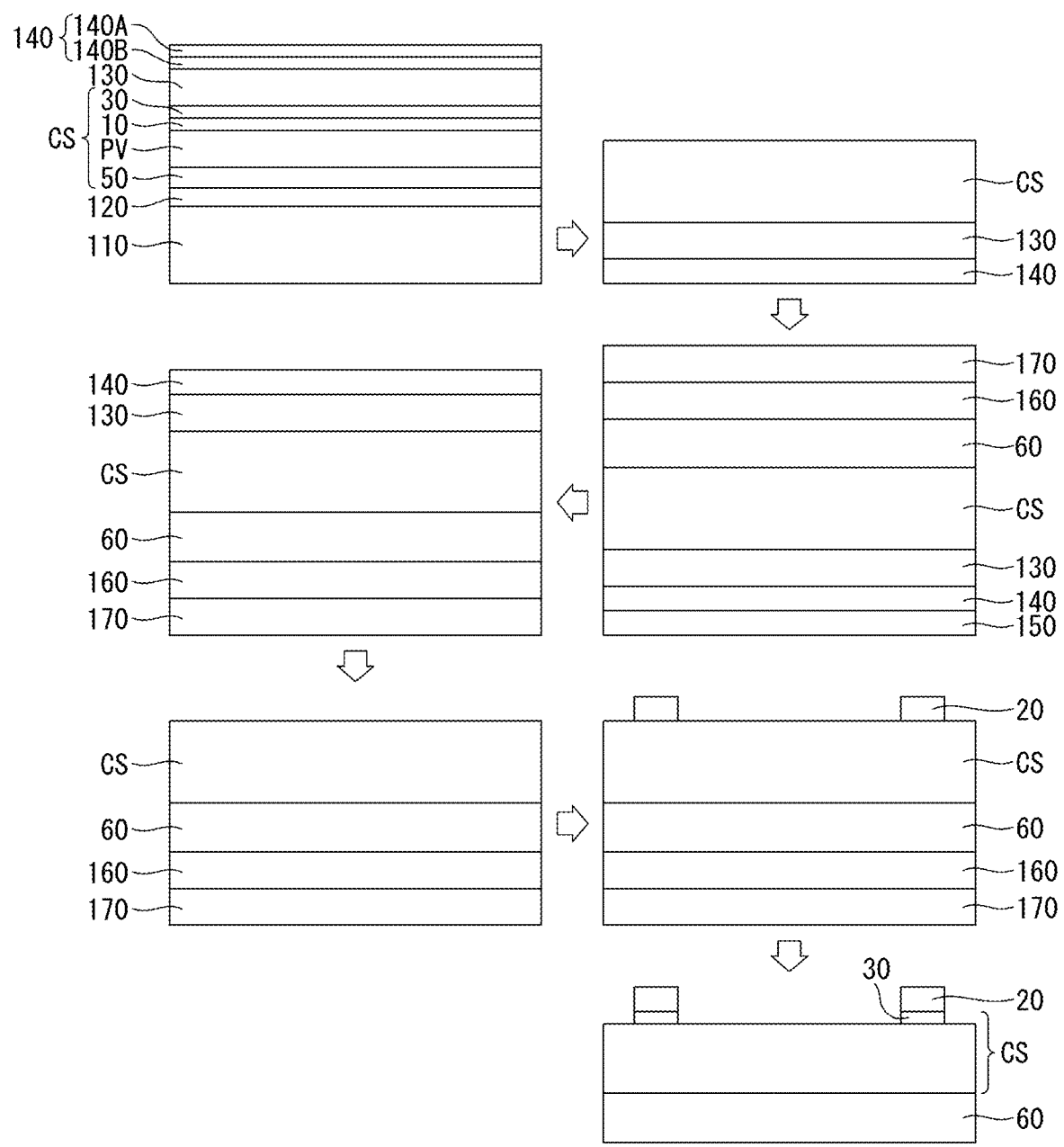
FIG. 2 is a process diagram illustrating in detail the manufacturing method illustrated in FIG. 1.

FIG. 1 is a block diagram illustrating a method of manufacturing a compound semiconductor solar cell according to a first embodiment of the disclosure. FIG. 2 is a process diagram illustrating in detail the manufacturing method illustrated in FIG. 1.

Figure 3:
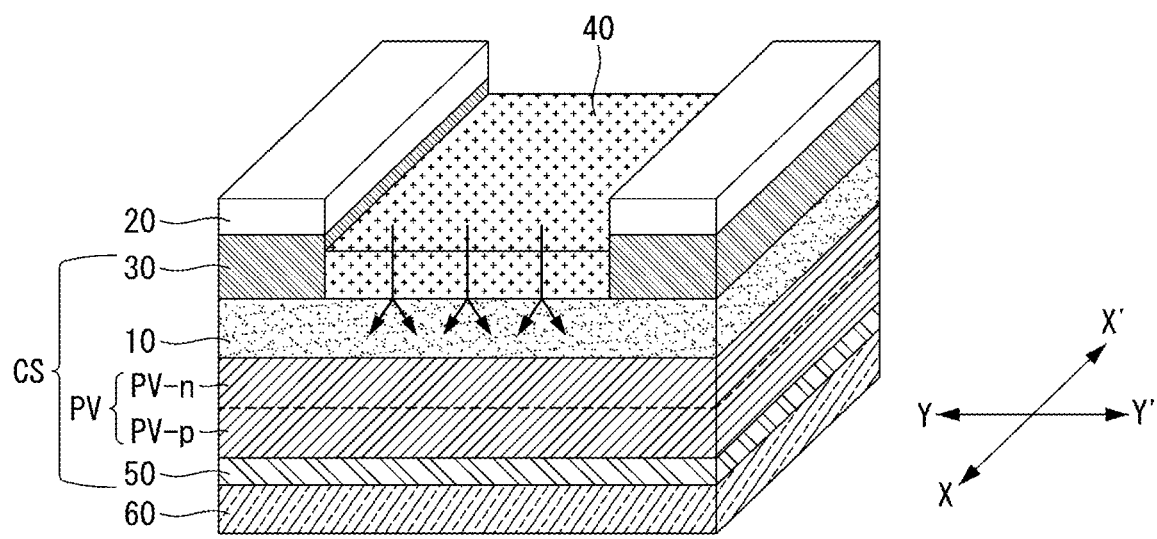
FIG. 3 is a perspective view of a compound semiconductor solar cell manufactured by the manufacturing method illustrated in FIGS. 1 and 2.
Figure 4:
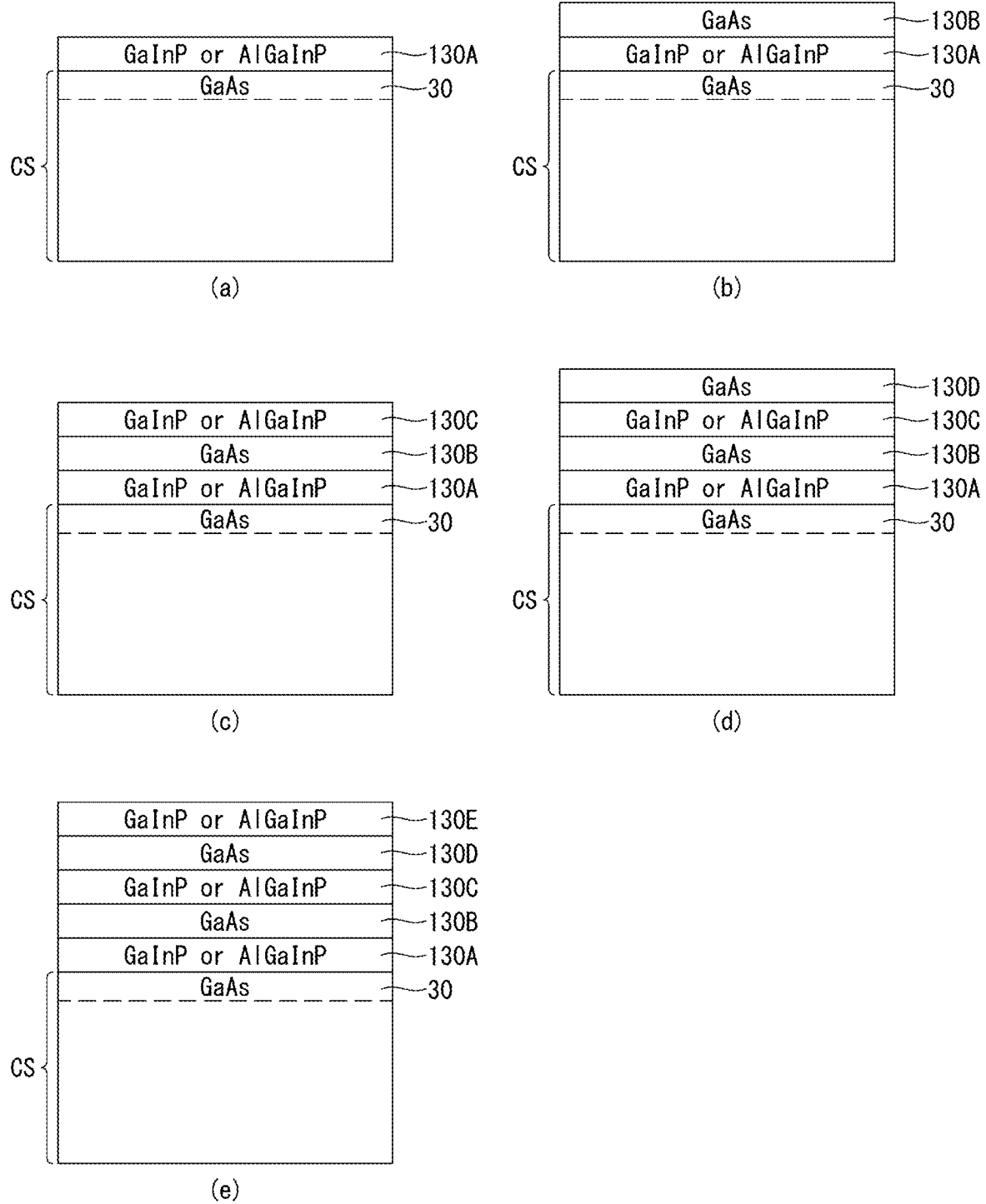
FIG. 4 is a cross-sectional view illustrating various implementations for forming a protective layer on a compound semiconductor layer of the compound semiconductor solar cell shown in FIG. 3.

FIG. 3 is a perspective view of a compound semiconductor solar cell manufactured by the manufacturing method illustrated in FIGS. 1 and 2. FIG. 4 is a cross-sectional view illustrating various implementations for forming a protective layer on a compound semiconductor layer of the compound semiconductor solar cell shown in FIG. 3.

Figure 5:
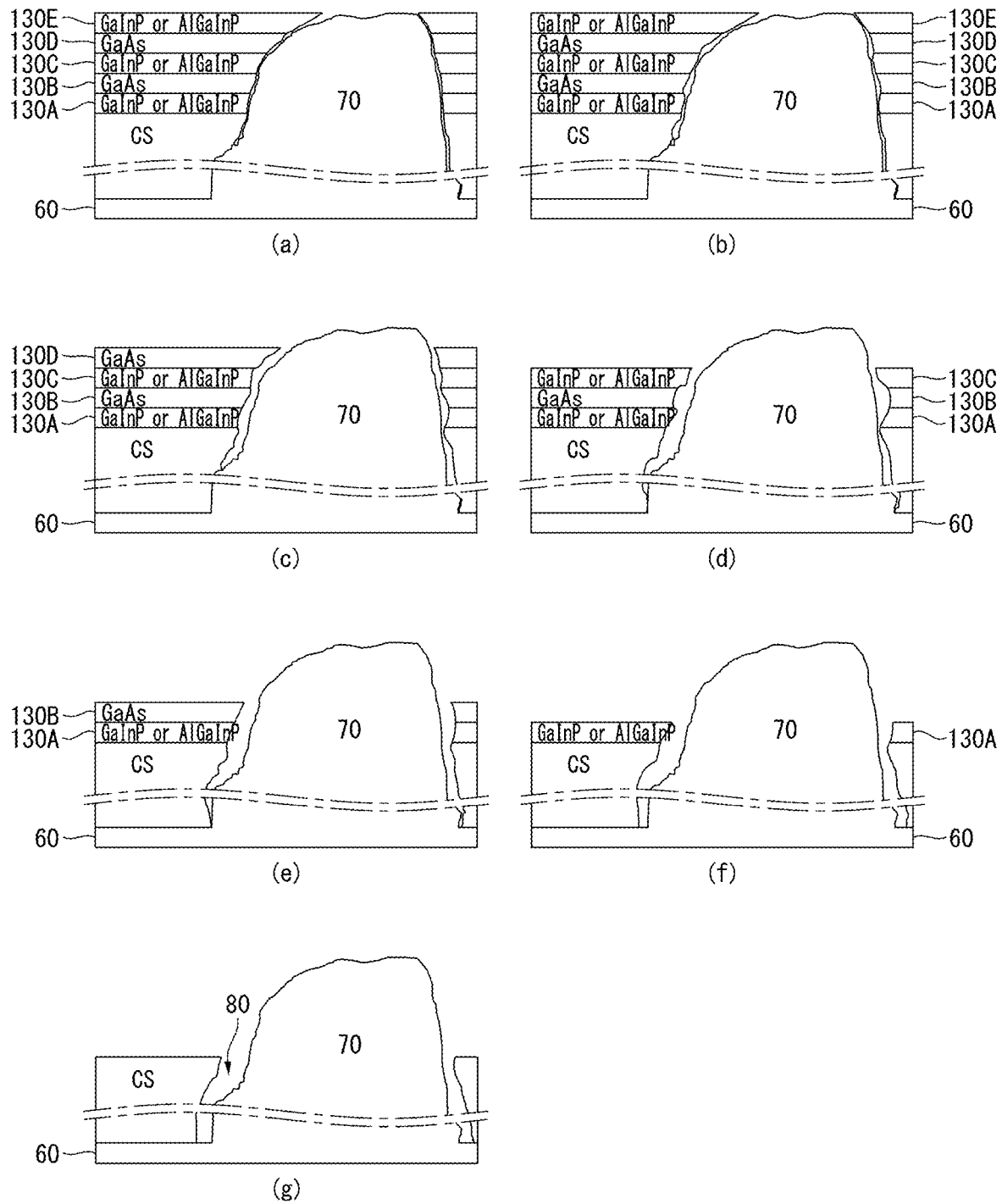
FIG. 5 is a cross-sectional view illustrating an example of an etching process for forming an isolation portion around a defect portion.
Figure 6:
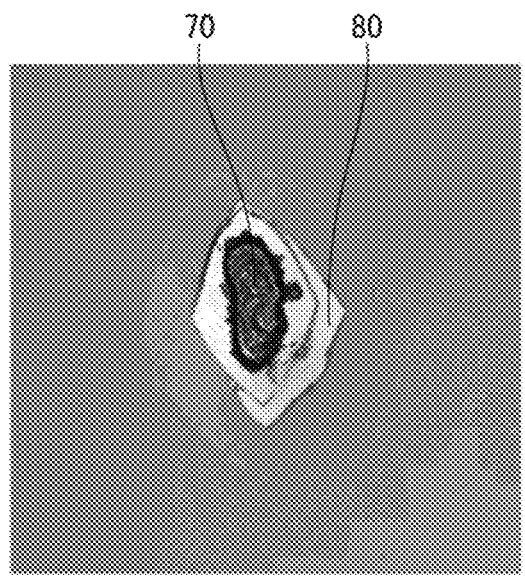
FIG. 6 illustrates a plane shape of a defect portion and an isolation portion that is finally formed according to the etching process illustrated in FIG. 5.

FIG. 5 is a cross-sectional view illustrating an example of an etching process for forming an isolation portion around a defect portion. FIG. 6 illustrates a plane shape of a defect portion and an isolation portion that is finally formed according to the etching process illustrated in FIG. 5.

Figure 7:
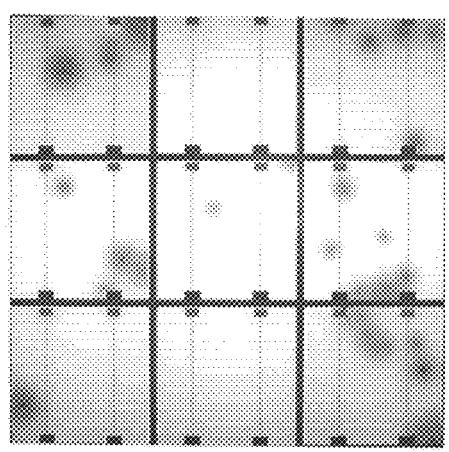
FIG. 7 illustrates photoluminescence (PL) images of a plurality of compound semiconductor solar cells before and after an isolation portion is formed.
Figure 7:
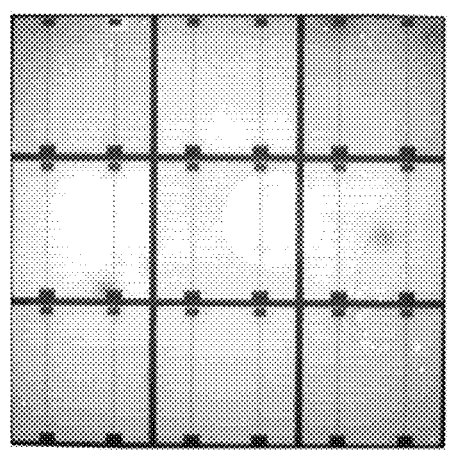

FIG. 7 illustrates photoluminescence (PL) images of a plurality of compound semiconductor solar cells before and after an isolation portion is formed. FIG. 8 illustrates efficiency data of a plurality of compound semiconductor solar cells before and after an isolation portion is formed.

Hereinafter, a compound semiconductor solar cell manufactured by a manufacturing method according to a first embodiment of the disclosure is described.

A compound semiconductor solar cell may include a light absorbing layer PV, a window layer 10 positioned on a front surface of the light absorbing layer PV, a plurality of front electrodes 20 positioned on a front surface of the window layer 10, a front contact layer 30 positioned between the window layer 10 and the front electrodes 20, an anti-reflective layer 40 positioned on the window layer 10, a back contact layer 50 positioned on a back surface of the light absorbing layer PV, and a back electrode 60 positioned on a back surface of the back contact layer 50.

In embodiments disclosed herein, the back contact layer 50, the light absorbing layer PV, the window layer 10, and the front contact layer 30 form a compound semiconductor layer CS.

At least one of the anti-reflective layer 40, the window layer 10, the front contact layer 30, and the back contact layer 50 may be omitted, if necessary or desired. However, embodiments of the disclosure describe the compound semiconductor solar cell including the above components 40, 10, 30 and 50 as an example, as shown in FIG. 3.

The light absorbing layer PV may include a III-VI semiconductor compound. For example, the light absorbing layer PV may include gallium indium phosphide (GaInP) containing gallium (Ga), indium (In), and phosphorus (P) or gallium arsenide (GaAs) containing gallium (Ga) and arsenic (As).

In the following description, embodiments of the disclosure are described using an example where the light absorbing layer PV includes GaAs.

The light absorbing layer PV may include a p-type semiconductor layer PV-p doped with impurities of a first conductivity type, for example, p-type impurities and an n-type semiconductor layer PV-n doped with impurities of a second conductivity type, for example, n-type impurities.

The light absorbing layer PV may further include a back surface field layer positioned on a back surface of the p-type semiconductor layer PV-p.

The p-type semiconductor layer PV-p may be formed by doping the above-described compound with impurities of the first conductivity type, for example, p-type impurities. The n-type semiconductor layer PV-n may be formed by doping the above-described compound with impurities of the second conductivity type, for example, n-type impurities.

In embodiments disclosed herein, the p-type impurities may be selected from carbon, magnesium, zinc, or a combination thereof, and the n-type impurities may be selected from silicon, selenium, tellurium, or a combination thereof.

The n-type semiconductor layer PV-n may be positioned in an area adjacent to the front electrodes 20 and may operate as a base layer. The p-type semiconductor layer PV-p may be positioned just below the n-type semiconductor layer PV-n in an area adjacent to the back electrode 60 and may operate as an emitter layer.

Namely, a distance between the n-type semiconductor layer PV-n and the front electrode 20 may be less a distance between the p-type semiconductor layer PV-p and the front electrode 20. Further, a distance between the n-type semiconductor layer PV-n and the back electrode 60 may be greater a distance between the p-type semiconductor layer PV-p and the back electrode 60.

Because the p-type semiconductor layer PV-p and the n-type semiconductor layer PV-n form a p-n junction inside the light absorbing layer PV, electron-hole pairs produced by light incident on the light absorbing layer PV may be separated into electrons and holes due to an internal potential difference formed by the p-n junction of the light absorbing layer PV. Then, the electrons may move to an n-type element, and the holes may move to a p-type element.

Thus, the holes produced in the light absorbing layer PV may move to the back electrode 60 through the back contact layer 50, and the electrons produced in the light absorbing layer PV may move to the front electrodes 20 through the window layer 10 and the front contact layer 30.

On the contrary, the p-type semiconductor layer PV-p may be positioned in an area adjacent to the front electrodes 20, and the n-type semiconductor layer PV-n may be positioned just below the p-type semiconductor layer PV-p in an area adjacent to the back electrode 60. In this instance, the holes produced in the light absorbing layer PV may move to the front electrodes 20 through the front contact layer 30, and the electrons produced in the light absorbing layer PV may move to the back electrode 60 through the back contact layer 50.

When the light absorbing layer PV further includes the back surface field layer, the back surface field layer may have the same conductivity type as a layer (i.e., the p-type semiconductor layer PV-p or the n-type semiconductor layer PV-n) directly contacting the back surface field layer as an upper layer of the back surface field layer and may be formed of the same material as the window layer 10.

The back surface field layer may be entirely formed on a back surface of the layer (i.e., the p-type semiconductor layer PV-p or the n-type semiconductor layer PV-n) directly contacting the back surface field layer as the upper layer of the back surface field layer, in order to efficiently block carriers (for example, holes or electrons), that have to move to the front electrodes 20, from moving to the back electrode 60.

Namely, when the solar cell shown in FIG. 3 includes the back surface field layer on a back surface of the p-type semiconductor layer PV-p, the back surface field layer can block electrons from moving to the back electrode 60 and may be positioned on the entire back surface of the p-type semiconductor layer PV-p in order to efficiently block electrons from moving to the back electrode 60.

The light absorbing layer PV having the above-described configuration may be manufactured from a mother substrate by a metal organic chemical vapor deposition (MOCVD) method, a molecular beam epitaxy (MBE) method, or other proper methods for forming an epitaxial layer.

The p-type semiconductor layer PV-p and the n-type semiconductor layer PV-n may be made of the same material having the same band gap to form homojunction. Alternatively, they may be made of different materials having different band gaps to form heterojunction.

The window layer 10 may be positioned between the light absorbing layer PV and the front electrodes 20 and may be formed by doping a III-VI semiconductor compound with impurities of the second conductivity type, for example, n-type impurities.

Unlike FIG. 3, when the p-type semiconductor layer PV-p is positioned on the n-type semiconductor layer PV-n and the window layer 10 is positioned on the p-type semiconductor layer PV-p, the window layer 10 may include impurities of the first conductivity type, for example, p-type impurities.

However, the window layer 10 may not include p-type impurities or n-type impurities.

The window layer 10 performs a passivation operation on the front surface of the light absorbing layer PV. Thus, when carriers (e.g., electrons or holes) move to the surface of the light absorbing layer PV, the window layer 10 can prevent a recombination of the carriers at the surface of the light absorbing layer PV.

Because the window layer 10 is disposed on the front surface (i.e., a light incident surface) of the light absorbing layer PV, the window layer 10 may have an energy band gap higher than an energy band gap of the light absorbing layer PV in order to scarcely absorb light incident on the light absorbing layer PV.

The window layer 10 may include more aluminum (Al) so that the energy band gap of the window layer 10 is higher than the energy band gap of the light absorbing layer PV.

The anti-reflective layer 40 may be positioned in a remaining area excluding a formation area of the front electrodes 20 and/or the front contact layer 30 from the front surface of the window layer 10.

Alternatively, the anti-reflective layer 40 may be positioned on the front electrodes 20 and the front contact layer 30 as well as an exposed portion of the window layer 10.

In this instance, the compound semiconductor solar cell may further include a bus bar electrode physically connecting the plurality of front electrodes 20, and the bus bar electrode may not be covered by the anti-reflective layer 40 and may be exposed to the outside.

The anti-reflective layer 40 having the above-described configuration may include magnesium fluoride, zinc sulfide, titanium oxide, silicon oxide, derivatives thereof, or combinations thereof.

The plurality of front electrodes 20 may be extended in a first direction X-X' and may be spaced apart from one another at a predetermined distance along a second direction Y-Y' perpendicular to the first direction X-X'.

The front electrodes 20 having the above-described configuration may include an electrically conductive material, for example, at least one of gold (Au), germanium (Ge), and nickel (Ni).

The front contact layer 30 between the window layer 10 and the front electrode 20 may be formed by doing a III-VI semiconductor compound with impurities of the second conductivity type at a doping concentration higher than an impurity doping concentration of the window layer 10.

The front contact layer 30 forms an ohmic contact between the window layer 10 and the front electrode 20. Namely, when the front electrode 20 directly contacts the window layer 10, an ohmic contact between the front electrode 20 and the light absorbing layer PV is not satisfactorily formed due to the low impurity doping concentration of the window layer 10. Thus, carriers moving to the window layer 10 cannot easily move to the front electrode 20 and may be disappeared.

However, when the front contact layer 30 is formed between the window layer 10 and the front electrode 20, a movement of carriers can be smoothly performed by the front contact layer 30 forming the ohmic contact together with the front electrode 20. Thus, a short circuit current density Jsc of the compound semiconductor solar cell can increase, and the efficiency of the compound semiconductor solar cell can be further improved.

A doping concentration of impurities of the second conductivity type doped on the front contact layer 30 may be higher than a doping concentration of impurities of the second conductivity type doped on the window layer 10, so that the front contact layer 30 forms the ohmic contact together with the front electrode 20.

The front contact layer 30 may have the same plane shape as the front electrode 20.

When the light absorbing layer PV includes the back surface field layer on the back surface of the p-type semiconductor layer PV-p of the light absorbing layer PV, the back contact layer 50 on a back surface of the back surface field layer may be entirely positioned on the back surface of the light absorbing layer PV. The back contact layer 50 may be formed by doing a III-VI semiconductor compound with impurities of the first conductivity type at a doping concentration higher than an impurity doping concentration of the p-type semiconductor layer PV-p.

The back contact layer 50 may form an ohmic contact together with the back electrode 60. Hence, the short circuit current density Jsc of the compound semiconductor solar cell can be further improved. As a result, the efficiency of the compound semiconductor solar cell can be further improved.

Each of a thickness of the front contact layer 30 and a thickness of the back contact layer 50 may be 100 nm to 300 nm. For example, the thickness of the front contact layer 30 may be 100 nm, and the thickness of the back contact layer 50 may be 300 nm.

The back electrode 60 on the back surface of the back contact layer 50 may be formed using a sheet-shaped conductor positioned on the entire back surface of the back contact layer 50, unlike the front electrode 20. Namely, the back electrode 60 may be referred to as a sheet electrode positioned on the entire back surface of the back contact layer 50.

In this instance, the back electrode 60 may have the same planar area as the light absorbing layer PV. The back electrode 60 may be formed as a single layer or a plurality of layers including at least one selected from among gold (Au), platinum (Pt), titanium (Ti), tungsten (W), silicon (Si), nickel (Ni), magnesium (Mg), palladium (Pd), copper (Cu), and germanium (Ge). The material forming the back electrode 60 may be appropriately selected in consideration of a conductivity type of the back contact layer 50.

For example, when the back contact layer 50 includes p-type impurities, the back electrode 60 may be formed of one selected from among Au, Pt/Ti, W—Si alloy (WSi), and Si/Ni/Mg/Ni. For example, the back electrode 60 may be formed of gold (Au) generating a low contact resistance between the back electrode 60 and the p-type back contact layer 50.

Further, when the back contact layer 50 includes n-type impurities, the back electrode 60 may be formed of one selected from among Pd/Au, Cu/Ge, Ni/Ge—Au alloy (GeAu)/Ni, and Au/Ti. For example, the back electrode 60 may be formed of Pd/Au generating a low contact resistance between the back electrode 60 and the n-type back contact layer 50.

In addition, the material forming the back electrode 60 may be appropriately selected from among the above materials. In particular, the material of the back electrode 60 may be appropriately selected from among materials generating the low contact resistance between the back electrode 60 and the back contact layer 50.

The compound semiconductor solar cell having the above-described configuration further includes a defect portion 70 and an isolation portion 80. The defect portion 70 passes through the compound semiconductor layer CS from a back surface of the compound semiconductor layer CS, protrudes from a front surface of the compound semiconductor layer CS, and is physically and electrically connected to the back electrode 60. The isolation portion 80 surrounds or encloses the defect portion 70 and forms a gap between the defect portion 70 and the compound semiconductor layer CS.

The defect portion 70 may be formed of the same metal material as the back electrode 60, and may include a protrusion that extends away from the back electrode 60.

The defect portion 70 and the isolation portion 80 are shown in only FIG. 5 for simplicity of illustration. Thus, it is obvious that the compound semiconductor solar cell shown in FIG. 3 includes the defect portion 70 and the isolation portion 80.

A method of manufacturing the compound semiconductor solar cell having the above-described configuration is described below.

A method of manufacturing a compound semiconductor solar cell according to the embodiment of the disclosure includes forming an uppermost layer of a compound semiconductor layer using a first compound semiconductor that has a high selectivity to a first etching solution and is etched by a second etching solution; forming a protective layer including a single layer or at least two layers at the uppermost layer of the compound semiconductor layer, the single layer being formed of a second compound semiconductor that has a high selectivity to the second etching solution and is etched by the first etching solution, the at least two layers being formed by alternately laminating a layer formed of the second compound semiconductor and a layer formed of the first compound semiconductor; performing a first etching process using the first etching solution or the second etching solution that has a high selectivity to the first compound semiconductor or the second compound semiconductor forming a layer positioned at an uppermost part of the protective layer; performing a second etching process using the second etching solution or the first etching solution to remove the layer positioned at the uppermost part of the protective layer; and repeatedly performing the first etching process and the second etching process until the protective layer is completely removed and selectively removing a portion of the compound semiconductor layer directly contacting a defect portion to thereby form an isolation portion surrounding the defect portion, the isolation portion exposing the side of the defect portion.

More specifically, the method of manufacturing the compound semiconductor solar cell according to the embodiment of the disclosure roughly includes an operation S10 of forming a sacrifice layer on one surface of a mother substrate; an operation S20 of forming a compound semiconductor layer on the sacrifice layer; an operation S30 of forming a protective layer including a compound semiconductor on the compound semiconductor layer; an operation S40 of attaching a first lamination film to the protective layer; an operation S50 of performing an epitaxial liftoff (ELO) process to remove the sacrifice layer and separate the compound semiconductor layer, the protective layer, and the first lamination film from the mother substrate; an operation S60 of forming a back electrode on the compound semiconductor layer; an operation S70 of attaching a second lamination film to the back electrode; an operation S80 of removing the first lamination film; an operation S90 of removing the protective layer and forming an isolation portion; and an operation S100 of forming a front electrode on the compound semiconductor layer.

In the operation S10, a sacrifice layer 120 is formed on one surface of a mother substrate 110 serving as a base for providing a proper lattice structure in which a light absorbing layer PV is formed. In the operation S20, a compound semiconductor layer CS is formed on the sacrifice layer 120.

The compound semiconductor layer CS may include a back contact layer 50, the light absorbing layer PV, a window layer 10, and a front contact layer 30.

When the compound semiconductor layer CS includes the front contact layer 30, the front contact layer 30 may be entirely formed on the window layer 10 during a process for manufacturing the solar cell and may be formed of a first compound semiconductor (e.g., GaAs) having good electrical conductivity for an ohmic contact.

Because the first compound semiconductor (e.g., GaAs) has a high selectivity to a first etching solution including hydrochloric acid, the first compound semiconductor is not removed in an etching process using the first etching solution and can function to protect underlying layers. The first compound semiconductor is removed in an etching process using a second etching solution in which ammonia solution, hydrogen peroxide solution, and ultrapure water are mixed.

For example, the second etching solution may be formed by mixing ammonia solution, hydrogen peroxide solution, and ultrapure water at a ratio of 1:2:10.

Subsequently, a protective layer 130 including a compound semiconductor is formed on the compound semiconductor layer CS in the operation S30.

As shown in (a) of FIG. 4, the protective layer 130 may include a single layer, for example, a first layer 130A formed of a compound semiconductor (preferably, a second compound semiconductor selected from among GaInP and AlGaInP) other than GaAs.

Because the second compound semiconductor (e.g., GaInP or AlGaInP) has a high selectivity to the second etching solution, the second compound semiconductor is not removed in the etching process using the second etching solution and can function to protect underlying layers. The second compound semiconductor is removed in the etching process using the first etching solution.

As another example, the protective layer 130 may include at least two layers in which a layer formed of the second compound semiconductor and a layer formed of the first compound semiconductor are alternately laminated.

More specifically, as shown in (b) of FIG. 4, the protective layer 130 may include the first layer 130A and a second layer 130B that is positioned on the first layer 130A and is formed of the first compound semiconductor (e.g., GaAs).

As another example, as shown in (c) of FIG. 4, the protective layer 130 may include the first layer 130A, the second layer 130B, and a third layer 130C that is positioned on the second layer 130B and is formed of the second compound semiconductor (e.g., GaInP or AlGaInP).

As another example, as shown in (d) of FIG. 4, the protective layer 130 may include the first layer 130A, the second layer 130B, the third layer 130C, and a fourth layer 130D that is positioned on the third layer 130C and is formed of the first compound semiconductor (e.g., GaAs).

As another example, as shown in (e) of FIG. 4, the protective layer 130 may include the first layer 130A, the second layer 130B, the third layer 130C, the fourth layer 130D, and a fifth layer 130E that is positioned on the fourth layer 130D and is formed of the second compound semiconductor (e.g., GaInP or AlGaInP).

As another example, a lamination structure of the protective layer 130 may be substantially the same as a lamination structure of the compound semiconductor layer CS.

A layer formed of the first compound semiconductor (or the second compound semiconductor) included in the protective layer 130 may be grown at a process temperature lower than a minimum process temperature (about 600° C. to 700° C.) used to grow a layer formed of the first compound semiconductor (or the second compound semiconductor) included in the compound semiconductor layer CS by about 50° C. to 100° C. and also may be grown at a growth rate that is 1.2 to 4 times larger than a maximum growth rate used to grow a layer formed of the first compound semiconductor (or the second compound semiconductor) included in the compound semiconductor layer CS.

The sacrifice layer 120, the compound semiconductor layer CS, and the protective layer 130 may be formed by a metal organic chemical vapor deposition (MOCVD) method, a molecular beam epitaxy (MBE) method, or other proper methods for forming an epitaxial layer and also may be formed by a regular growth method.

Next, a first lamination film 140 may be attached to the protective layer 130 in the operation S40.

The first lamination film 140 may include a polyethylene terephthalate (PET) film 140A serving as a support substrate and an ethylene vinyl acetate (EVA) film 140B that is positioned on one surface of the PET film 140A and serves as an adhesive.

When each of the PET film 140A and the EVA film 140B is formed to a thickness of 25 μm to 75 μm, and the first lamination film 140 is attached to the protective layer 130 at a temperature of 70° C. to 150° C., the PET film 140A is condensed and greatly modified due to a temperature reduction of the first lamination film 140 when the ELO process is performed. Therefore, time required in the ELO process can be reduced, and the productivity of large-area compound semiconductor solar cells can be improved.

For example, each of the PET film 140A and the EVA film 140B may be formed to the thickness of 50 μm, and the first lamination film 140 may be attached to the protective layer 130 at a temperature of 100° C.

Next, the ELO process is performed to remove the sacrifice layer 120 in the operation S50.

The ELO process may use hydrogen fluoride (HF) as an etching solution. When the ELO process is performed to remove the sacrifice layer 120 using hydrogen fluoride (HF), the compound semiconductor layer CS, the protective layer 130, and the first lamination film 140 can be separated from the mother substrate 110. Further, the separation process can be completed in a short time due to the modification of the first lamination film 140.

When the ELO process is performed, particles positioned inside the compound semiconductor layer CS and the protective layer 130 are removed during a formation of the compound semiconductor layer CS and the protective layer 130. Hence, an empty space is formed in the compound semiconductor layer CS and the protective layer 130.

Next, a first carrier substrate 150 is attached to a back surface of the first lamination film 140 in a state where the first lamination film 140 is disposed below the protective layer 130, and a back electrode 60 is formed on the compound semiconductor layer CS in the operation S60.

The back electrode 60 may be formed as a single layer or a plurality of layers including at least one selected from among gold (Au), platinum (Pt), titanium (Ti), tungsten (W), silicon (Si), nickel (Ni), magnesium (Mg), palladium (Pd), copper (Cu), and germanium (Ge).

When the back electrode 60 is formed, an electrode forming material is filled in the empty space provided inside the compound semiconductor layer CS and the protective layer 130 to form a defect portion 70. The defect portion 70 is formed of the same metal material as the back electrode 60. The defect portion 70 is shown in FIG. 5.

Next, a second lamination film 160 is attached to the back electrode 60 in the operation S70.

The second lamination film 160 may have the same structure as the first lamination film 140 and may be attached through the same method as the first lamination film 140.

Next, a second carrier substrate 170 is disposed downwardly in a state where the second carrier substrate 170 is attached to the second lamination film 160, and then the first carrier substrate 150 and the first lamination film 140 are removed in the operation S80.

Next, the protective layer 130 is removed, and an isolation portion 80 is formed in the operation S90.

With reference to FIG. 5, an example where the protective layer 130 includes first to fifth layers 130A to 130E is described.

When the protective layer includes at least two layers, the isolation portion may be formed and the protective layer may be also removed by alternatively performing an etching process using an etching solution having a high selectivity to the first compound semiconductor or the second compound semiconductor forming a layer positioned at an uppermost part of the protective layer.

As described above, because the first compound semiconductor (e.g., GaAs) has a high selectivity to the first etching solution including hydrochloric acid, the first compound semiconductor is not removed in an etching process using the first etching solution and can function to protect underlying layers (see (a) of FIG. 5). The first compound semiconductor is removed in an etching process using the second etching solution in which ammonia solution, hydrogen peroxide solution, and ultrapure water are mixed.

In this instance, the second etching solution may be formed by mixing ammonia solution, hydrogen peroxide solution, and ultrapure water at a ratio of 1:2:10.

Thus, the second etching solution may be used to remove the second layer 130B and the fourth layer 130D formed of the first compound semiconductor.

Further, because the second compound semiconductor (e.g., GaInP or AlGaInP) has a high selectivity to the second etching solution, the second compound semiconductor is not removed in the etching process using the second etching solution and can function to protect underlying layers. The second compound semiconductor is removed in the etching process using the first etching solution.

Thus, the first etching solution may be used to remove the first layer 130A, the third layer 130C, and the fifth layer 130E formed of the second compound semiconductor.

Because the layer positioned at the uppermost part of the protective layer 130 is the fifth layer 130E, the etching process using the second etching solution, to which the second compound semiconductor forming the fifth layer 130E has the high selectivity, is first performed.

As shown in (b) of FIG. 5, when the etching process using the second etching solution is performed, the fourth layer 130D and the second layer 130B at a portion contacting the defect portion 70 is etched. Further, a layer (formed of the first compound semiconductor (e.g., GaAs)) included in the compound semiconductor layer CS is etched at a portion contacting the defect portion 70.

In the above etching process, the compound semiconductor layer CS and the protective layer 130 at a portion, in which the defect portion 70 is not formed, are protected.

The etching process using the second etching solution may be performed for about 20 seconds to 4 minutes.

Subsequently, the etching process using the first etching solution including hydrochloric acid is performed.

As shown in (c) of FIG. 5, when the etching process using the first etching solution is performed, the fifth layer 130E formed of the second compound semiconductor is removed, and the third layer 130C and the first layer 130A at a portion contacting the defect portion 70 are etched.

Further, a layer (formed of the second compound semiconductor (e.g., GaInP or AlGaInP)) included in the compound semiconductor layer CS is etched at a portion contacting the defect portion 70.

The etching process using the first etching solution may be performed for about 10 seconds to 10 minutes.

Each of the first layer 130A, the third layer 130C, and the fifth layer 130E is formed of the second compound semiconductor, and each of the second layer 130B and the fourth layer 130D is formed of the first compound semiconductor. Several layers included in the compound semiconductor layer CS are formed of the first compound semiconductor or the second compound semiconductor.

Thus, when the etching process (see (d) of FIG. 5) using the second etching solution, the etching process (see (e) of FIG. 5) using the first etching solution, the etching process (see (f) of FIG. 5) using the second etching solution, and the etching process (see (g) of FIG. 5) using the first etching solution are sequentially performed, the protective layer 130 may be removed and also the isolation portion 80 may be formed as shown in (g) of FIG. 5.

As described above, the isolation portion 80 is formed by removing the compound semiconductor layer CS and the protective layer 130 at a portion directly contacting the defect portion 70. Therefore, as shown in FIG. 6, a planar shape of the isolation portion 80 is similar to a planar shape of the defect portion 70, and a portion of the back electrode 60 on the side of the defect portion 70 is exposed by the isolation portion 80.

Accordingly, because the size of the isolation portion 80 can be minimized, a reduction in a light incident area resulting from the isolation portion 80 can be minimized.

Further, the planar shape of the isolation portion 80 is approximatively similar to the planar shape of the defect portion 70. Therefore, when two or more defect portions 70 are provided and have different planar shapes, the isolation portions 80 surrounding the defect portions 70 may have different planar shapes.

Next, the front electrodes 20 are formed on the compound semiconductor layer CS in the operation S100.

The front electrodes 20 may be formed by depositing a metal only on a region where the front electrodes 20 are to be formed, or depositing a front electrode material on the front contact layer 30 and patterning the front electrode material.

When the front electrodes 20 are formed, the front electrodes 20 may not be formed in a region where the defect portion 70 and the isolation portion 80 are positioned. In this instance, the front electrodes 20 passing the region where the defect portion 70 and the isolation portion 80 are positioned may be spaced apart from each other along the first direction with respect to the defect portion 70 and the isolation portion 80.

FIG. 5 illustrates that the defect portion 70 protrudes a lot from an uppermost layer of the compound semiconductor layer CS, by way of example. However, a height of the defect portion 70 may be formed lower than an upper surface of the front electrode 20.

Subsequently, the front contact layer 30 is patterned on a region that is not covered by the front electrodes 20 using the front electrodes 20 as a mask, and then the second carrier substrate 170 and the second lamination film 160 are removed. As a result, the compound semiconductor solar cell shown in FIG. 3 is manufactured.

So far, the embodiment of the disclosure described that the compound semiconductor solar cell includes one light absorbing layer, by way of example. However, a plurality of light absorbing layers may be provided.

In this instance, a lower light absorbing layer may absorb light of a long wavelength band and include GaAs performing photoelectric conversion, and an upper light absorbing layer may absorb light of a short wavelength band and include GaInP performing photoelectric conversion. A tunnel junction layer may be positioned between the upper light absorbing layer and the lower light absorbing layer.

An intrinsic semiconductor layer may be formed between a p-type semiconductor layer and an n-type semiconductor layer of a light absorbing layer.

In FIG. 7, (a) illustrates a photoluminescence (PL) image of a plurality of compound semiconductor solar cells before an isolation portion is formed, and (b) illustrates a PL image of a plurality of compound semiconductor solar cells after an isolation portion according to an embodiment of the disclosure is formed.

In FIG. 8, (a) illustrates efficiency data of the plurality of compound semiconductor solar cells shown in (a) of FIG. 7, and (b) illustrates efficiency data of the plurality of compound semiconductor solar cells shown in (b) of FIG. 7.

As shown in FIGS. 7 and 8, a large number of defective regions resulting from the defect portion were measured in the plurality of compound semiconductor solar cells before the isolation portion is formed. Hence, efficiency of the plurality of compound semiconductor solar cells was entirely reduced. However, defective regions resulting from the defect portion were remarkably reduced in the plurality of compound semiconductor solar cells after the isolation portion is formed. Hence, efficiency of the plurality of compound semiconductor solar cells was entirely increased.

Hereinafter, a compound semiconductor solar cell according to a second embodiment of the disclosure and a method of manufacturing the same are described with reference to FIGS. 9 to 13.

Figure 9:
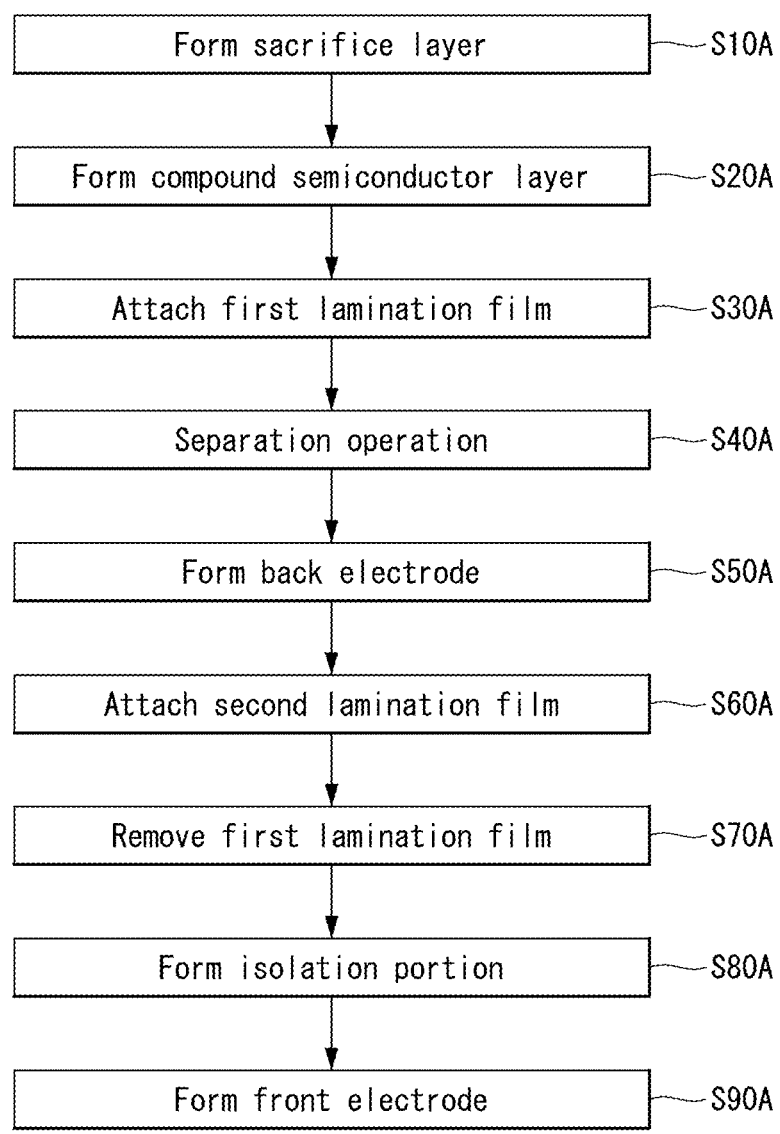
FIG. 9 is a block diagram illustrating a method of manufacturing a compound semiconductor solar cell according to a second embodiment of the disclosure.
Figure 10:
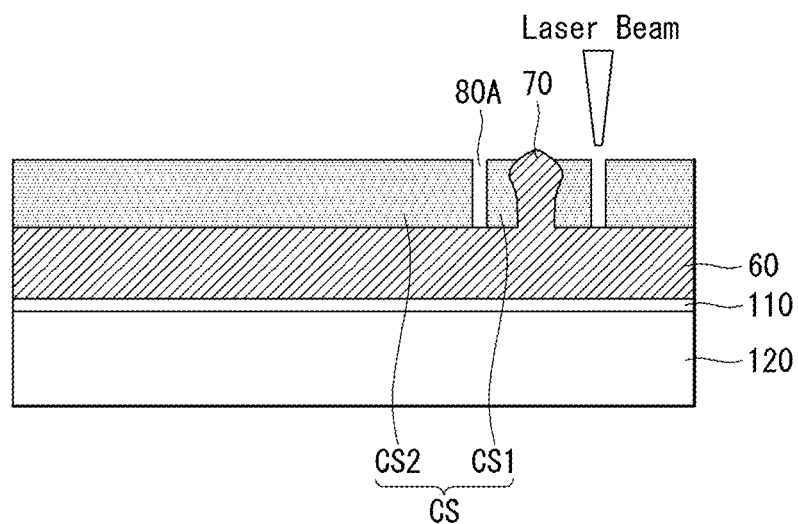
FIG. 10 is a process diagram illustrating a method for forming an isolation portion of FIG. 9.

FIG. 9 is a block diagram illustrating a method of manufacturing a compound semiconductor solar cell according to a second embodiment of the disclosure. FIG. 10 is a process diagram illustrating a method for forming an isolation portion of FIG. 9.

Figure 11:
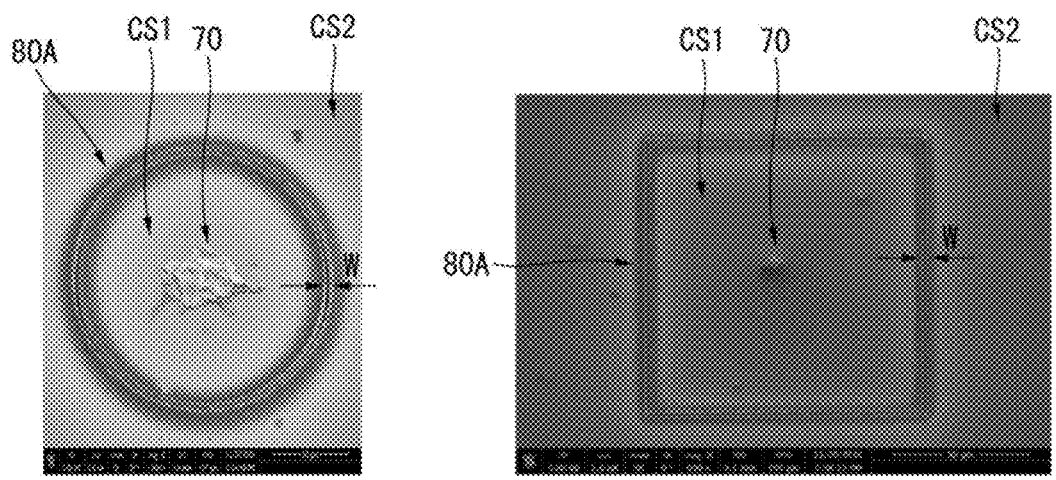
FIG. 11 is a photograph of various planar shapes of an isolation portion formed by a method shown in FIG. 10.
Figure 12:
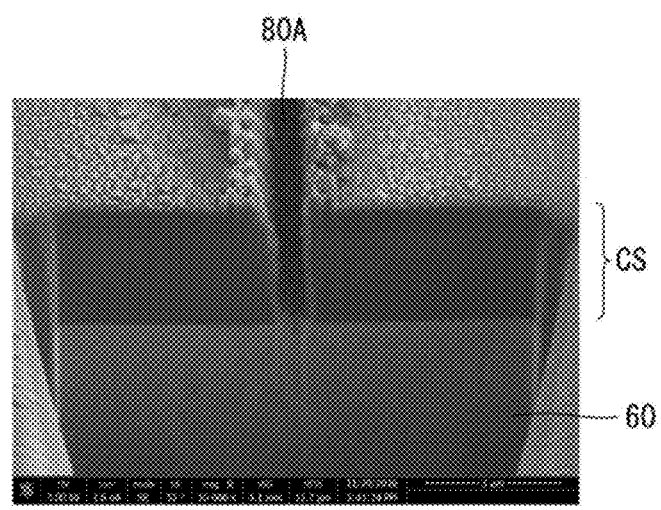
FIG. 12 is a photograph of a cross-sectional shape an isolation portion formed by a method shown in FIG. 10.

FIG. 11 is a photograph of various planar shapes of an isolation portion formed by the method shown in FIG. 10. FIG. 12 is a photograph of a cross-sectional shape an isolation portion formed by the method shown in FIG. 10.

Since basic configuration of a compound semiconductor solar cell manufactured by a manufacturing method according to the second embodiment of the disclosure is substantially the same as that of the compound semiconductor solar cell shown in FIG. 3, a further description may be briefly made or may be entirely omitted.

In the manufacturing method according to the first embodiment of the disclosure, the isolation portion 80 is formed to expose the side of the defect portion 70.

However, in the manufacturing method according to the second embodiment of the disclosure, a compound semiconductor layer CS1 directly contacting a defect portion 70 is positioned between an isolation portion 80A and the defect portion 70. Further, the compound semiconductor layer CS1 is physically spaced apart from a compound semiconductor layer CS2 positioned in an outer space of the isolation portion 80A by the isolation portion 80A.

The isolation portion 80A has a linewidth W of 1 μm or less. Thus, a separation distance between the compound semiconductor layer CS1 and the compound semiconductor layer CS2 is the same as the linewidth W of the isolation portion 80A.

As shown in FIG. 11, the isolation portion 80A may have a circular or quadrilateral planar shape. The isolation portion 80A may have an oval planar shape or a polygonal planar shape other than a quadrilateral planar shape.

When the isolation portion 80A is formed in the circular planar shape, the isolation portion 80A having the circular planar shape may have a diameter of 20 µm to 300 µm.

When the isolation portion 80A is formed in the quadrilateral planar shape, the isolation portion 80A having the quadrilateral planar shape may have four sides, each of which has a length of 20 µm to 300 µm.

One compound semiconductor solar cell may include at least two isolation portions 80A, and at least two isolation portions 80A may have the same planar shape or different planar shapes.

A method of manufacturing a compound semiconductor solar cell according to a second embodiment of the disclosure is described below.

A method of manufacturing a compound semiconductor solar cell according to the second embodiment of the disclosure roughly includes an operation S10A of forming a sacrifice layer on one surface of a mother substrate; an operation S20A of forming a compound semiconductor layer on the sacrifice layer; an operation S30A of attaching a first lamination film to the compound semiconductor layer; an operation S40A of performing an epitaxial liftoff (ELO) process to remove the sacrifice layer and separate the compound semiconductor layer and the first lamination film from the mother substrate; an operation S50A of forming a back electrode on the compound semiconductor layer in a state where the first lamination film is positioned at a lower part; an operation S60A of attaching a second lamination film to the back electrode; an operation S70A of removing the first lamination film in a state where the second lamination film is positioned at a lower part; an operation S80A of forming an isolation portion; and an operation S90A of forming a front electrode on the compound semiconductor layer.

Since the sacrifice layer forming operation S10A, the compound semiconductor layer forming operation S20A, the first lamination film attaching operation S30A, the separation operation 40A, the back electrode forming operation S50A, the second lamination film attaching operation S60A, the first lamination film removing operation S70A, and the front electrode forming operation S90A in the second embodiment of the disclosure are substantially the same as the sacrifice layer forming operation S10, the compound semiconductor layer forming operation S20, the first lamination film attaching operation S40, the separation operation 50, the back electrode forming operation S60, the second lamination film attaching operation S70, the first lamination film removing operation S80, and the front electrode forming operation S100 in the first embodiment of the disclosure described with reference to FIG. 1, respectively, a description thereof is omitted.

As shown in FIG. 9, the manufacturing method according to the second embodiment of the disclosure does not include the protective layer forming operation S30 included in the manufacturing method according to the first embodiment of the disclosure. Therefore, the isolation portion forming operation S80A performed subsequent to the first lamination film removing operation S70A in the second embodiment of the disclosure is different from the isolation portion forming operation S90 in the first embodiment of the disclosure.

More specifically, after the first lamination film is removed, the isolation portion 80A may be formed by irradiating a laser onto a compound semiconductor layer CS around the defect portion 70 and removing the compound semiconductor layer CS to a linewidth of 1 µm or less.

When the isolation portion 80A is formed, only the compound semiconductor layer CS may be removed without removing the back electrode 60. If the back electrode 60 is removed by the laser, an electrode material forming the back electrode 60 may be evaporated and again deposited on the side of the compound semiconductor layer CS exposed by the isolation portion 80A. Hence, the isolation of the defect portion 70 cannot be efficiently performed due to the again deposited electrode material.

When the isolation portion 80A is formed, the compound semiconductor layer CS1, that is positioned in an inner space of the isolation portion 80A and directly contacts the defect portion 70, is physically spaced apart from the compound semiconductor layer CS2 positioned in an outer space of the isolation portion 80A by the isolation portion 80A. A separation distance between the compound semiconductor layer CS1 and the compound semiconductor layer CS2 is the same as the linewidth of the isolation portion 80A.

The isolation portion 80A may have at least one of a circular planar shape, an oval planar shape, or a polygonal planar shape. A femtosecond laser having a wavelength of 248 nm, 355 nm, or 532 nm and a frequency of 100 kHz to 150 kHz may be used to form the isolation portion 80A, so that the back electrode 60 is not removed.

When the compound semiconductor layer CS is removed through the irradiation of the laser, an inert gas, for example, a nitrogen gas or an argon gas may be supplied to a laser irradiation region during the irradiation of the laser, in order to prevent a reactant generated during the process from being again deposited on the side of the compound semiconductor layer CS exposed by the isolation portion 80A.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a compound semiconductor solar cell including a back electrode, a compound semiconductor layer, and a defect portion disposed within the compound semiconductor layer, the method comprising:
   removing a portion of the compound semiconductor layer around the defect portion using a femtosecond laser to form an isolation portion enclosing the detect portion; and
   forming a front electrode on the compound semiconductor layer after forming the isolation portion,
   wherein when the isolation portion is formed, the isolation portion exposes a portion of the back electrode without removing the back electrode,
   wherein the defect portion is formed of the same material as the back electrode, and is physically connected to the back electrode, wherein the isolation portion includes a physical gap between the defect portion and the compound semiconductor layer, wherein the front electrode is not be formed in a region where the defect portion and the isolation portion are positioned, and wherein the back electrode comprises a metal.

2. The method of claim 1, wherein the femtosecond laser has a wavelength of 248 nm, 355 nm, or 532 nm, and a frequency of 100 kHz to 150 kHz.

3. The method of claim 1, wherein the defect portion includes at least one selected from among gold (Au), platinum (Pt), titanium (Ti), tungsten (W), silicon (Si), nickel (Ni), magnesium (Mg), palladium (Pd), copper (Cu), and germanium (Ge).

4. The method of claim 1, wherein the forming of the isolation portion includes removing the portion of the compound semiconductor layer around the defect portion so that the isolation portion is formed in at least one planar shape of a circular planar shape, an oval planar shape, and a polygonal planar shape, and the isolation portion has a linewidth of 1 μm or less.

5. The method of claim 4, wherein when the femtosecond laser is irradiated, an inert gas is supplied to a laser irradiation region of the compound semiconductor layer.

6. The method of claim 5, wherein the inert gas includes at least one of a nitrogen gas and an argon gas.

* * * * *